(12) United States Patent
Tang

(10) Patent No.: US 8,072,740 B2
(45) Date of Patent: *Dec. 6, 2011

(54) ELECTRONIC DEVICE WITH SUPPORT MECHANISM

(75) Inventor: Zi-Ming Tang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 112 days.

This patent is subject to a terminal disclaimer.

(21) Appl. No.: 12/535,679

(22) Filed: Aug. 5, 2009

(65) Prior Publication Data

US 2011/0002091 A1    Jan. 6, 2011

(30) Foreign Application Priority Data

Jul. 6, 2009    (CN) .......................... 2009 1 0304040

(51) Int. Cl.
*H05K 7/14*    (2006.01)

(52) U.S. Cl. ..................... 361/679.01; 349/58

(58) Field of Classification Search ............. 361/679.01, 361/679.02, 679.21, 679.22; 248/917–924, 248/560; 349/58–60
See application file for complete search history.

(56) References Cited

U.S. PATENT DOCUMENTS

| | | | | |
|---|---|---|---|---|
| 5,028,913 A * | 7/1991 | Kitamura | ............... | 361/679.27 |
| 6,594,143 B2 * | 7/2003 | Yano et al. | ............... | 361/679.26 |
| 7,277,276 B2 * | 10/2007 | Tsukuda | ............... | 361/679.27 |
| 7,518,671 B2 * | 4/2009 | Maruta | ...................... | 349/58 |
| 2003/0081996 A1 * | 5/2003 | Sun et al. | .................. | 403/381 |
| 2007/0267549 A1 * | 11/2007 | Bang et al. | ............... | 248/122.1 |

* cited by examiner

*Primary Examiner* — Jayprakash N Gandhi
*Assistant Examiner* — Ingrid Wright
(74) *Attorney, Agent, or Firm* — Altis Law Group, Inc.

(57) ABSTRACT

An electronic device includes a connecting member, a housing, a positioning member, a display body, and an inner support mechanism. The positioning member is fixed to the housing. The display body is positioned on the housing and connected to the positioning member. The inner support mechanism has a support member and an adjustment member. The support member is fixed to the housing. The adjustment member is movably connected to the support member to maintain resistance to the positioning member.

9 Claims, 4 Drawing Sheets

ELECTRONIC DEVICE WITH SUPPORT MECHANISM

BACKGROUND

1. Technical Field

The present disclosure relates generally to electronic devices and, more particularly, to an electronic device with an adjustable support mechanism.

2. Description of Related Art

An electronic device, such as a flat panel display, often has a back housing and a front bezel positioned on the back housing. If the size and thinness of the flat panel display are increased, a middle portion of the bezel is easily bent. Therefore, the flat panel display generally has an inner support mechanism to support the bezel.

A frequently used support mechanism of the flat panel display includes two support bases and a plurality of support bars. The support bases are fixed on opposite ends of the back housing, and the support bars are horizontally positioned on the support bases and abut the bezel. However, the typical support mechanism has a complex structure, and a height of the support mechanism cannot be changed.

Therefore, an electronic device with a support mechanism which overcomes the described limitations is desired.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
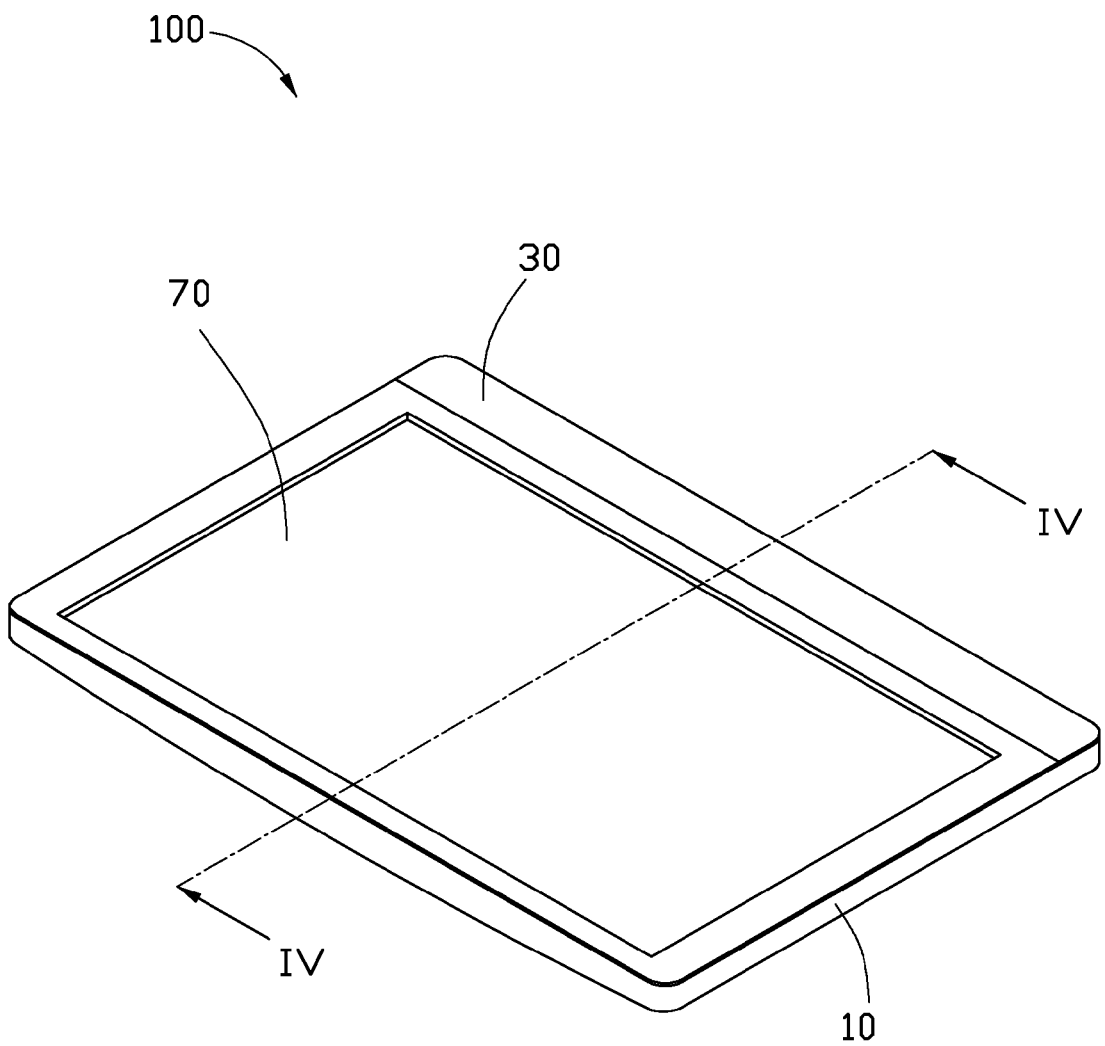
FIG. 1 is an isometric view of an embodiment of an electronic device, including a housing, a positioning member, a support mechanism and a display body.

Referring to FIG. 1, an embodiment of an electronic device 100 includes a housing 10, a positioning member 30, one or more inner support mechanisms 50 (see FIG. 2), and a display body 70. The support mechanism 50 is positioned between the housing 10 and the positioning member 30. The display body 70 is positioned on the housing 10, and connected to the positioning member 30. In the illustrated embodiment, the electronic device 100 is a flat panel display, and has one inner support mechanism 50.

Figure 2:
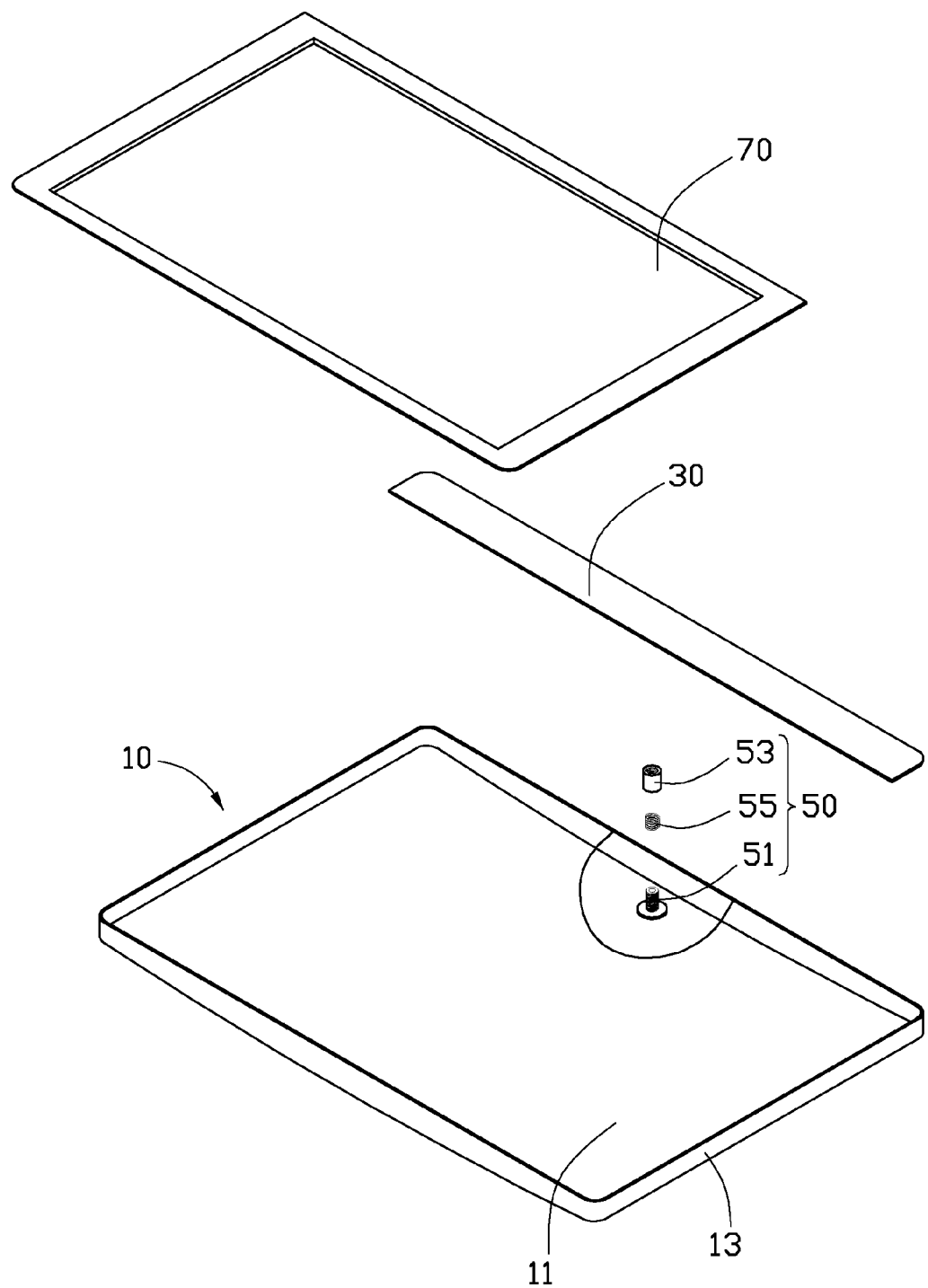
FIG. 2 is an exploded, isometric view of the electronic device of FIG. 1.

Referring to FIGS. 1 and 2, the housing 10 includes a base plate 11 and a sidewall 13 extending from an edge of the base plate 11. The positioning member 30 can be welded to a top end of the sidewall 13.

Figure 3:
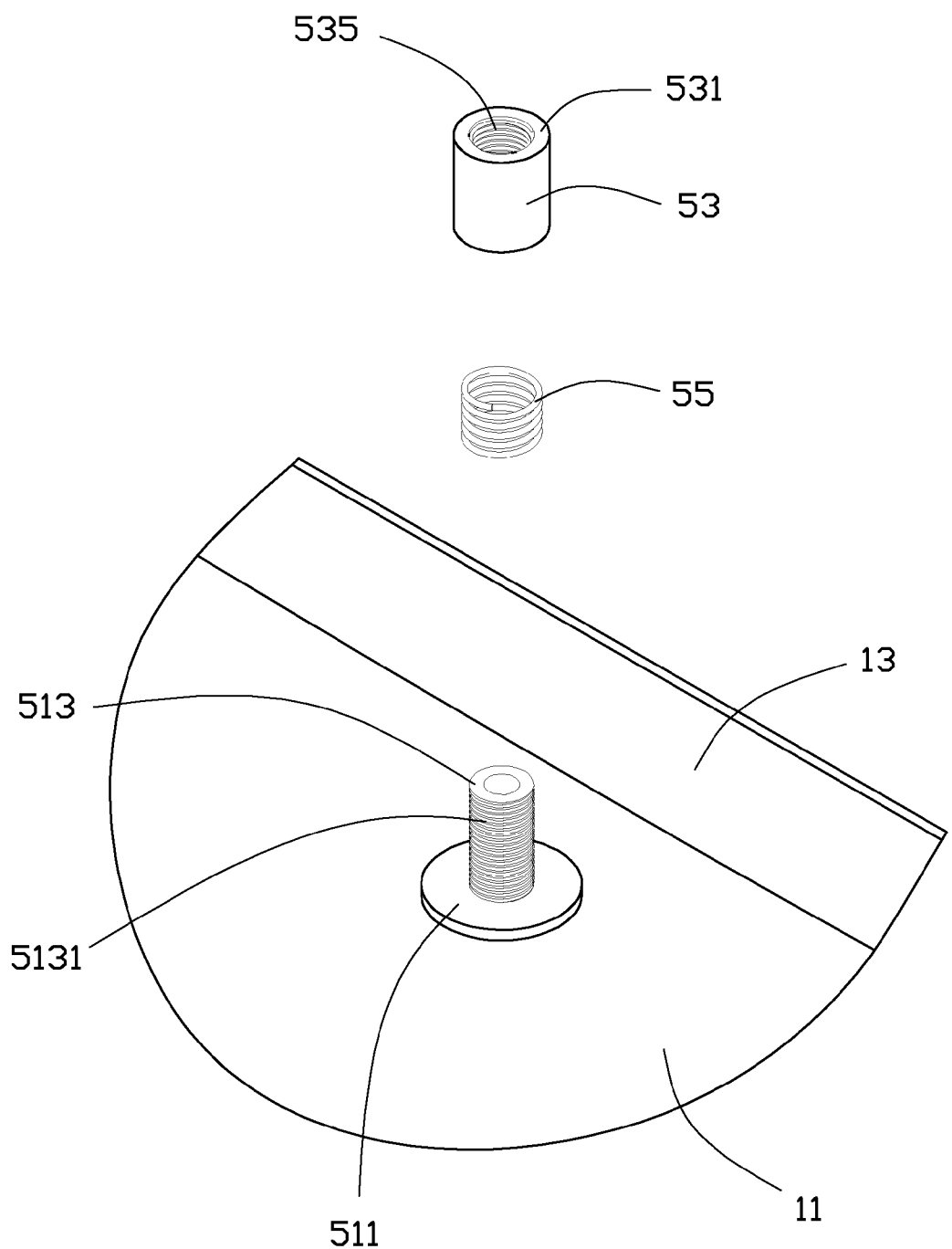
FIG. 3 is an exploded, isometric view of the support mechanism and the housing of FIG. 2.

Referring to FIGS. 2 and 3, the support mechanism 50 includes a support member 51 and an adjustment member 53 connected to the support member 51.

The support member 51 includes a support body 513 and a head portion 511 extending from an end of the support body 513. The head portion 511 of the support member 51 is fixed to the base plate 11 of the housing 10. A threaded portion 5131 is formed on the support body 513. In the illustrated embodiment, the support body 513 is substantially cylindrical, and the head portion 511 is welded to the base plate 11.

Figure 4:
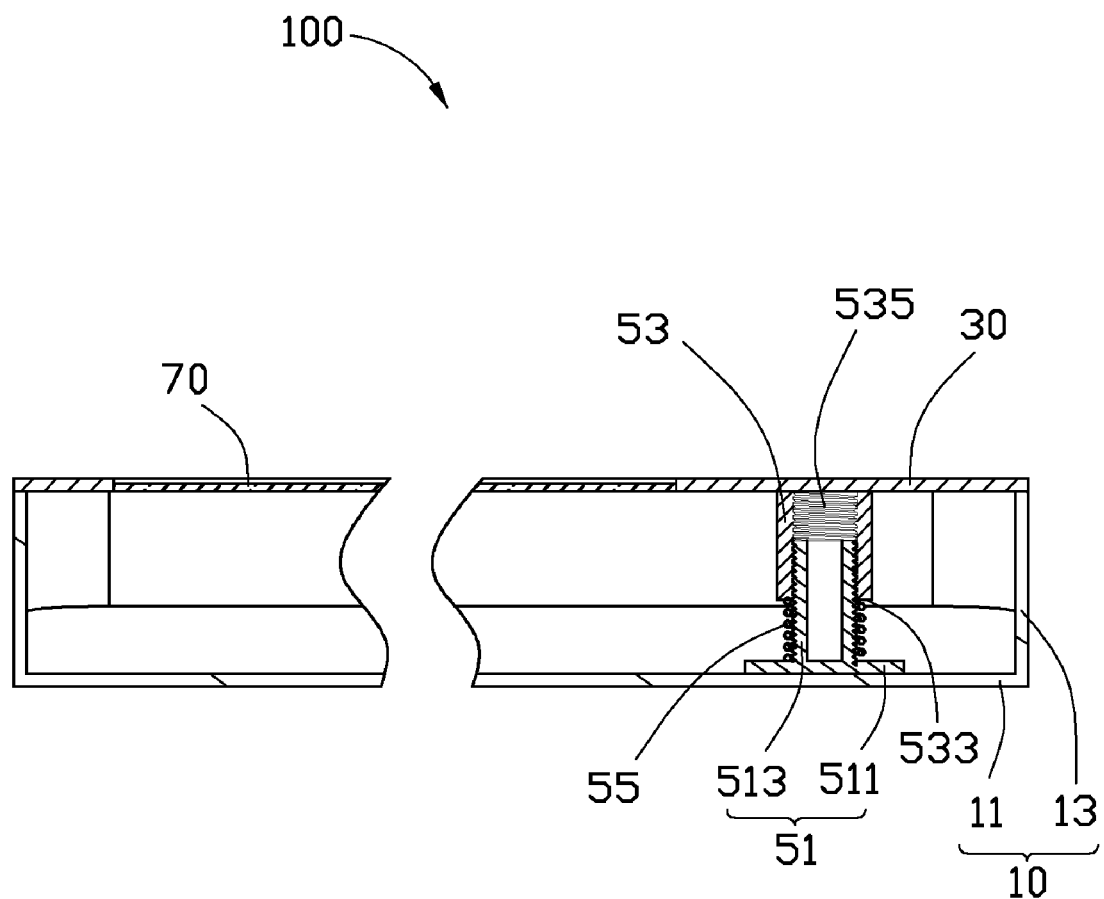
FIG. 4 is a cross-section of the electronic device of FIG. 1 taken along line IV-IV.

Referring to FIGS. 3 and 4, the adjustment member 53 is substantially cylindrical, and includes a first surface 531 and a second surface 533 opposite to the first surface 531. The adjustment member 53 defines a threaded hole 535 communicating the first surface 531 with the second surface 533. The adjustment member 53 is sleeved on the support body 513, with the threaded portion 5131 engaging with the threaded hole 535. A distance of the adjustment member 53 away from the base plate 11 can be adjusted by rotating the adjustment member 53.

The support mechanism 50 can further include an elastic member 55. In the illustrated embodiment, the elastic member 55 is a compression spring. The elastic member 55 is sleeved on the support body 513 of the support member 51, and resists the support member 51 and the adjustment member 53 respectively.

During assembly of the flat panel display 100, the support member 51 can be welded to a middle portion of a side of the base plate 11. The elastic member 55 and the adjustment member 53 are sleeved on the support body 513 of the support member 51. The positioning member 30 is welded to the top end of the sidewall 13 of the housing 10. The adjustment member 53 is rotated, so that the adjustment member 53 maintains a resistance of the positioning member 30. The display body 70 is connected to the positioning member 30.

The support mechanism 50 includes the support member 51 and the adjustment member 53 fastened thereto. Therefore, the support mechanism 50 has a simplified structure. In addition, a distance of the adjustment member 53 from the base plate 11 is adjustable such that the positioning member 30 is always firmly supported by the support mechanism 50. The elastic member 55 resists the support member 51 and the adjustment member 53 respectively to prevent the adjustment member 53 from loosening from the support member 51.

It should be pointed out that the flat panel display 100 may also include more than one support mechanism 50, arrayed on the base plate 11 as appropriate.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device, comprising:
   a housing;
   a positioning member fixed to the housing;
   a display body positioned on the housing, and connected to the positioning member; and
   an inner support mechanism positioned in the housing, the inner support mechanism comprising a support member fixed to one of the housing and the positioning member, and an adjustment member movably connected to the support member to maintain resistance on the other one of the housing and positioning member, such that a height of the positioning member relative to the housing is adjusted by adjusting the adjustment member.

2. The electronic device of claim 1, wherein the support member comprises a support body and a head portion extending from an end of the support body; the adjustment member is sleeved on the support body.

3. The electronic device of claim 2, wherein the support body is substantially cylindrical.

4. The electronic device of claim 2, wherein a threaded portion is formed on the support body; the adjustment member defines a threaded hole corresponding to the threaded portion.

5. The electronic device of claim 2, wherein the head portion is welded to the housing.

6. The electronic device of claim 1 further comprising an elastic member sleeved on the support member, and resisting the support member and the adjustment member respectively.

7. The electronic device of claim 6, wherein the elastic member is a compression spring.

8. The electronic device of claim 1, wherein the housing comprises a base plate and a sidewall extending from an edge of the base plate; the positioning member is fixed to a top edge of the sidewall.

9. The electronic device of claim 1, being a flat panel display.

* * * * *